United States Patent
Takahashi et al.

(10) Patent No.: US 11,765,927 B2
(45) Date of Patent: Sep. 19, 2023

(54) SEMICONDUCTOR DEVICE, METHOD OF MANUFACTURING THE SAME, DISPLAY DEVICE, PHOTOELECTRIC CONVERSION DEVICE, ELECTRONIC DEVICE, ILLUMINATION DEVICE, AND MOBILE OBJECT

(71) Applicant: CANON KABUSHIKI KAISHA, Tokyo (JP)

(72) Inventors: Tetsuo Takahashi, Kawasaki (JP); Koichi Ishige, Yokohama (JP); Ryuji Ishii, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 124 days.

(21) Appl. No.: 16/669,963

(22) Filed: Oct. 31, 2019

(65) Prior Publication Data
US 2020/0152911 A1  May 14, 2020

(30) Foreign Application Priority Data

Nov. 12, 2018  (JP) ................. 2018-212482

(51) Int. Cl.
*H10K 50/844* (2023.01)
*H10K 50/854* (2023.01)
*H10K 59/60* (2023.01)
*H10K 71/00* (2023.01)

(52) U.S. Cl.
CPC ......... *H10K 50/844* (2023.02); *H10K 50/854* (2023.02); *H10K 59/60* (2023.02); *H10K 71/00* (2023.02)

(58) Field of Classification Search
CPC . H01L 51/5253; H01L 51/56; H01L 51/5268; H01L 51/524; H10K 50/844; H10K 50/854; H10K 71/00; H10K 50/841
See application file for complete search history.

(56) References Cited

U.S. PATENT DOCUMENTS

| | | |
|---|---|---|
| 8,101,288 B2 | 1/2012 | Aiba et al. |
| 9,601,718 B2 | 3/2017 | Isaji |
| 2005/0269946 A1* | 12/2005 | Jeong .................. H01L 27/3258 313/504 |

(Continued)

FOREIGN PATENT DOCUMENTS

| | | |
|---|---|---|
| JP | 7-161474 A | 6/1995 |
| JP | 2000-077183 A | 3/2000 |

(Continued)

OTHER PUBLICATIONS

R. Kärcher et al., "Electronic Structure of Hydrogenated and Unhydrogenated Amorphous SiNx(0≤x≤1.6): A Photoemission Study," 30(4) Physical review B 1896-1910 (Aug. 1984).

(Continued)

*Primary Examiner* — Bac H Au
(74) *Attorney, Agent, or Firm* — VENABLE LLP

(57) ABSTRACT

There is provided a semiconductor device having a semiconductor element and a protective film that is disposed above the semiconductor element and contains silicon atoms and nitrogen atoms, wherein the protective film has an average number of nitrogen atoms bonded to one silicon atom of less than or equal to 1.35.

22 Claims, 10 Drawing Sheets

(56) References Cited

U.S. PATENT DOCUMENTS

| | | | |
|---|---|---|---|
| 2007/0170540 A1* | 7/2007 | Chung | B81C 1/00801 257/499 |
| 2013/0105806 A1* | 5/2013 | Liu | H01L 29/04 257/64 |
| 2013/0140547 A1* | 6/2013 | Lee | H01L 51/5256 257/40 |
| 2014/0034918 A1* | 2/2014 | Choung | H01L 51/56 257/40 |
| 2016/0013445 A1* | 1/2016 | Isaji | H01L 27/3258 257/40 |
| 2016/0118450 A1* | 4/2016 | Lee | H01L 51/56 257/40 |
| 2018/0004046 A1* | 1/2018 | Lee | G02F 1/133723 |
| 2019/0198585 A1* | 6/2019 | Chang | H01L 27/14 |
| 2019/0198813 A1 | 6/2019 | Isaji | |

FOREIGN PATENT DOCUMENTS

| | | |
|---|---|---|
| JP | 2007-123174 A | 5/2007 |
| JP | 2009-018568 A | 1/2009 |
| JP | 2013-131339 A | 7/2013 |
| WO | 2014/188731 A1 | 11/2014 |

OTHER PUBLICATIONS

Notice of Reasons for Refusal in Japanese Application No. 2018-212482 (dated Jun. 2022).

\* cited by examiner

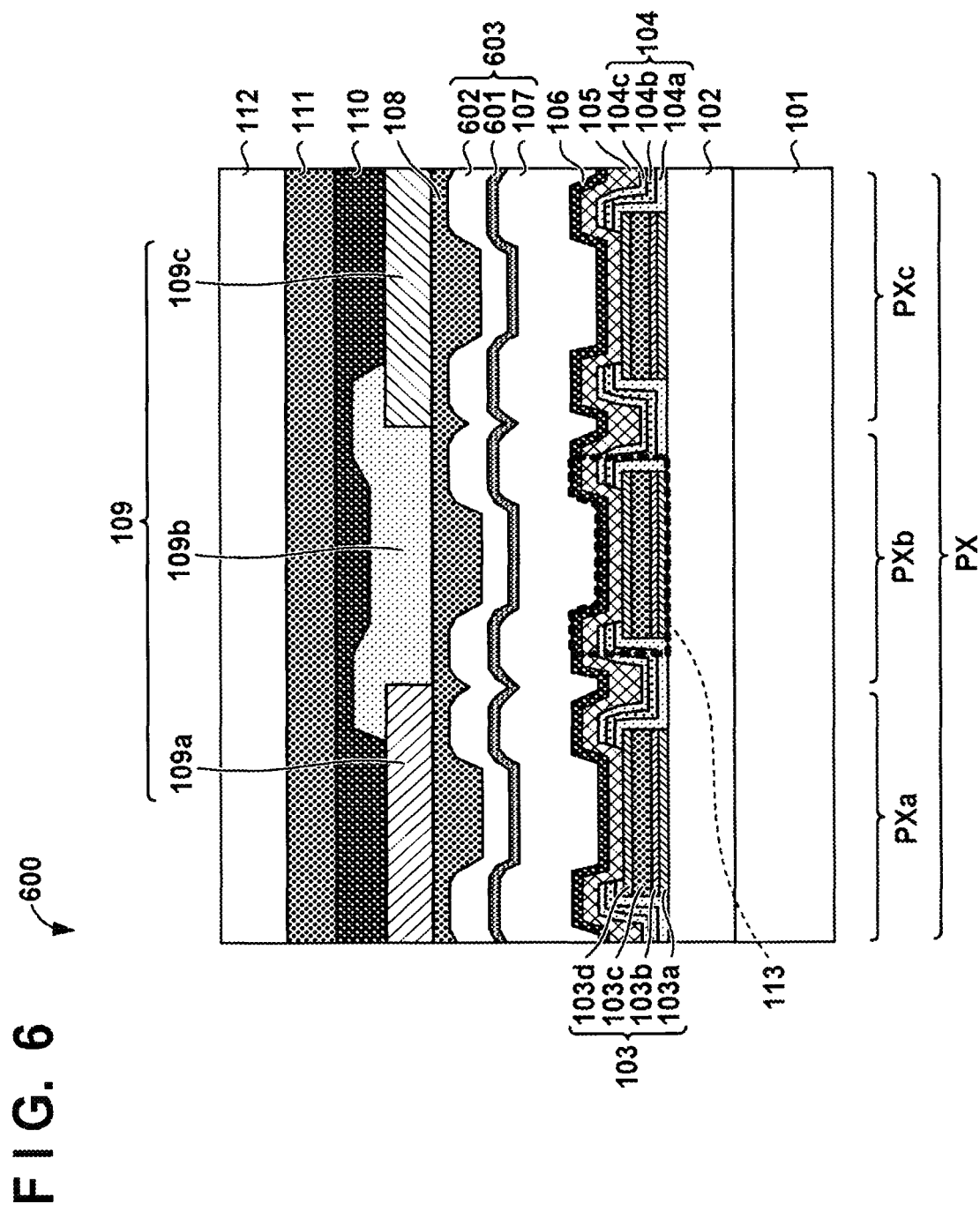

SEMICONDUCTOR DEVICE, METHOD OF MANUFACTURING THE SAME, DISPLAY DEVICE, PHOTOELECTRIC CONVERSION DEVICE, ELECTRONIC DEVICE, ILLUMINATION DEVICE, AND MOBILE OBJECT

BACKGROUND

Field of the Disclosure

The present disclosure relates to a semiconductor device, method of manufacturing the same, a display device, a photoelectric conversion device, an electronic device, an illumination device, and a mobile object.

Description of the Related Art

Organic light emitting devices that use organic electroluminescence (EL) films are known. It is known that while organic light emitting devices have excellent light emitting characteristics, their light emitting characteristics can be degraded by moisture. In order to maintain the characteristics of an organic light emitting device, it is preferable to suppress penetration of moisture into an organic light emitting element. Japanese Patent Laid-Open No. 2007-123174 (hereinafter PTL 1) describes an organic EL display panel having a plurality of organic EL elements and a barrier layer formed of silicon nitride covering the plurality of organic EL elements. In PTL 1, disclosure is made of an example that includes a region having a nitrogen concentration with respect to silicon in the barrier layer of 30 atomic % or more and 70 atomic % or less.

International Publication No. 2014/188731 (herein after PTL 2) describes a sealing film formed of silicon nitride. PTL 2 discloses an example in which a sum of a hydrogen concentration derived from Si—H and a hydrogen concentration derived from N—H in the sealing film is 3E22 atoms per cm$^3$ or more.

The present inventors have discovered that, when a protective film is formed of silicon nitride on a surface having unevenness, a low-density region may be formed in the protective film. Since this low-density region is likely to be penetrated by moisture, moisture will enter a semiconductor element such as an organic light emitting element that is under the protective film. Although silicon nitride having the compositions described in PTL 1 and 2 has excellent gas barrier properties as a solid, it has insufficient moisture resistance.

SUMMARY

The present disclosure provides a technique for improving the moisture resistance of a protective film.

In some embodiments of the present disclosure, there is provided a semiconductor device having a semiconductor element and a protective film that is disposed above the semiconductor element and contains silicon atoms and nitrogen atoms, wherein an average number of nitrogen atoms bonded to one silicon atom in the protective film is 1.35 or less.

Further features of the present invention will become apparent from the following description of exemplary embodiments (with reference to the attached drawings).

BRIEF DESCRIPTION OF THE DRAWINGS

FIG. 6 is a cross-sectional view schematically illustrating a configuration of an organic light emitting device according to a second embodiment of the present disclosure.

DESCRIPTION OF THE EMBODIMENTS

Figure 1:
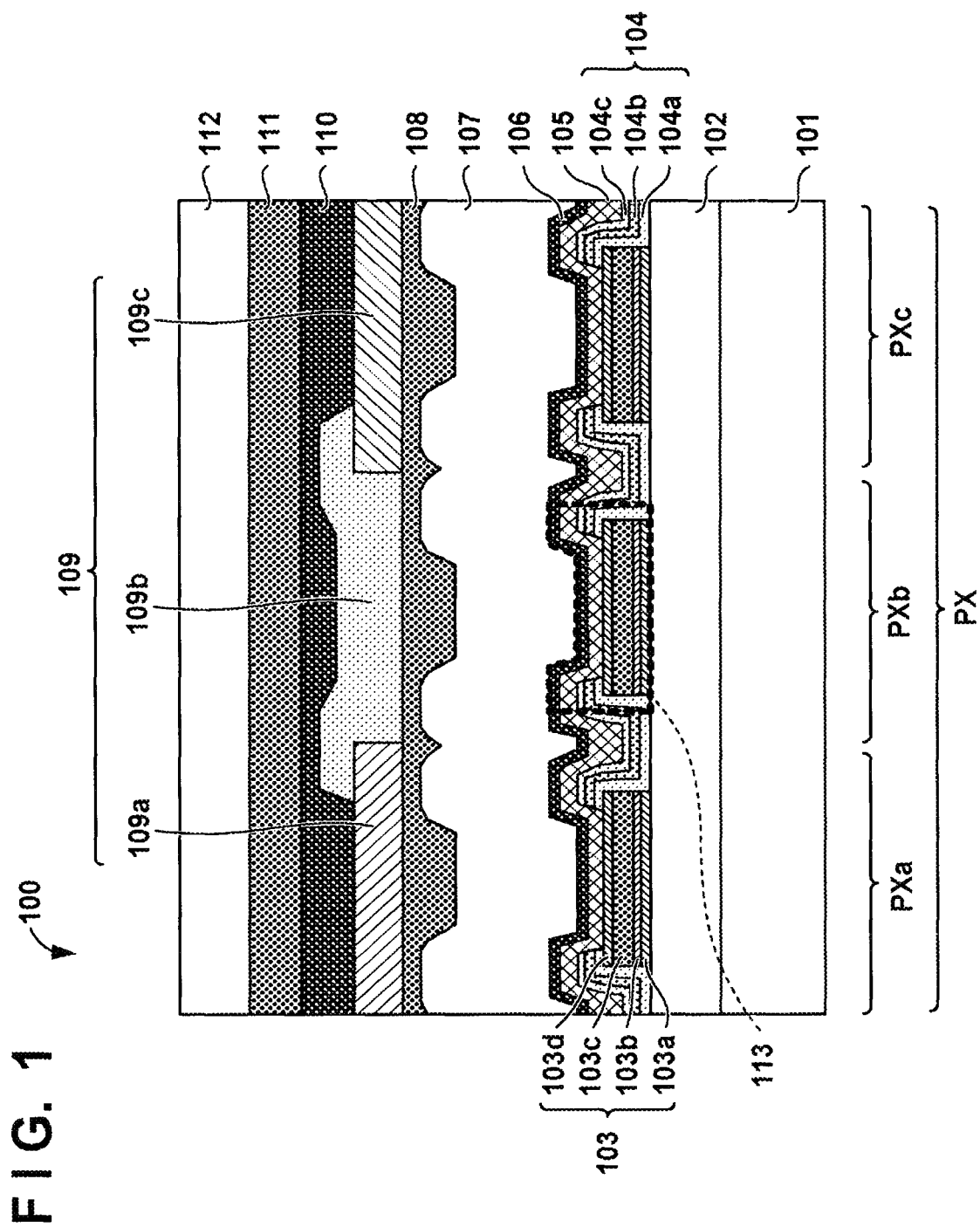
FIG. 1 is a cross-sectional view schematically illustrating a configuration of an organic light emitting device according to a first embodiment of the present invention.

Embodiments of the present disclosure are described below with reference to the accompanying drawings. The same reference numerals are added to similar elements throughout the various embodiments, and duplicate descriptions are omitted. The embodiments can be modified and combined as appropriate.

First Embodiment

A configuration example of an organic light emitting device 100 according to the first embodiment will be described with reference to FIG. 1. One pixel circuit PX of the organic light emitting device 100 has a cross-sectional structure that is illustrated in FIG. 1. A transistor and a wiring pattern (not illustrated) are arranged on a substrate 101 which is a glass substrate, a silicon substrate, or the like. An inorganic insulating film 102 is disposed on the transistor and the wiring pattern. The inorganic insulating film 102 is formed of, for example, silicon oxide, silicon nitride, or the like.

A plurality of electrodes 103 are arranged in an array at intervals on the inorganic insulating film 102. Each of the electrodes 103 may be configured by stacking a plurality of conductive layers having mutually different compositions. For example, the electrodes 103 may be configured from a Ti layer 103*a*, a TiN layer 103*b*, an AlCu layer 103*c*, and a Ti layer 103*d* in this order from a lower side (the side closer to the substrate 101). Each of the electrodes 103 is electrically connected, through a plug (not illustrated) formed in the inorganic insulating film 102, to a switching element (for example, a transistor) disposed on the substrate 101. The plug is formed of a conductive material such as tungsten, for example.

An insulator 104 is disposed so as to cover a portion of the upper surface of the inorganic insulating film 102 which is not covered by the plurality of electrodes 103. The insulator 104 is formed of, for example, an inorganic insulator. The insulator 104 further configures a bank by covering the side surface of each electrode 103 and the vicinity of an end portion of the upper surface of each electrode 103. The upper surface of each electrode 103 is not covered with the insulator 104 except in the vicinity of the end portion. The insulator 104 may be configured by stacking a plurality of insulating layers having mutually different compositions. For example, the insulator 104 may be configured by a TEOS-SiO layer 104a, an HDP-SiO layer 104b, and a TEOS-SiO layer 104c in this order from the lower side.

An organic compound film 105 is disposed on the plurality of electrodes 103 and the insulator 104. An electrode 106 is disposed on the organic compound film 105. The electrode 106 is formed of a transparent material so as to transmit light generated by the organic compound film 105.

The electrode 103, the insulator 104, the organic compound film 105, and the electrode 106 constitute an organic light emitting element 113. The organic compound film 105 is arranged between the electrode 103 and the electrode 106. The plurality of electrodes 103 are electrically connected to a plurality of switching elements disposed on the substrate 101 via plugs (not illustrated). Voltages applied to the plurality of electrodes 103 can be individually controlled by these switching elements. By applying a voltage between the electrodes 103 and the electrode 106, holes are injected into the organic compound film 105 through one surface of the organic compound film 105, and electrons are injected into the organic compound film 105 through the other surface of the organic compound film 105. In the organic compound film 105, injected holes and electrons recombine, thereby generating light. Therefore, an array including a plurality of organic light emitting elements 113 is formed by the above-described configuration. The organic compound film 105 is configured to generate white light, for example. The organic compound film 105 and the electrode 106 are provided in common to the plurality of organic light emitting elements 113. The electrodes 103 may be referred to as lower electrodes or individual electrodes. The electrode 106 may be referred to as an upper electrode or a common electrode.

A protective film 107 is disposed on the electrode 106, that is, on the organic light emitting element 113. The protective film 107 has a function of shielding the organic light emitting element 113 from moisture in an external atmosphere. In one example, the protective film 107 contains silicon atoms and nitrogen atoms. For example, the protective film 107 is a silicon nitride (SiN) film formed by chemical vapor deposition (CVD).

The lower surface of the protective film 107 has unevenness under the influence of the shape of the upper surface of the organic compound film 105 which is under the protective film 107. Since the upper surface of the organic compound film 105 has unevenness, resistance to electric charges injected from the electrode 106 in the lateral direction increases, and thus the number of electric charges moving to the adjacent organic light emitting element 113 to be recombined with other electric charges decreases. As a result, color mixing is suppressed.

When the protective film 107 is a silicon nitride film, the average number of nitrogen atoms bonded to one silicon atom in the protective film 107 may be 1.35 or less. The maximum number of nitrogen atoms bonded to one silicon atom is 4 when all of them are bonded in a stoichiometric ratio. The average number of nitrogen atoms bonded to one silicon atom being 1.35 or less means that the number of nitrogen atoms bonded to one silicon atom is smaller than the case where nitrogen atoms and silicon atoms are all bonded in a stoichiometric ratio. More specifically, the average number of nitrogen atoms bonded to one silicon atom may be 1.00 or more and 1.35 or less.

The average number of nitrogen atoms bonded to one silicon atom in the protective film 107 may be greater than 0, and may be 1 or more. The average number of nitrogen atoms bonded to one silicon atom in the protective film 107 may be greater than or equal to 1.05. As a result, the absorptance of light in the visible wavelength region of the silicon nitride film can be kept low. The average number of nitrogen atoms bonded to one silicon atom in the protective film 107 may be greater than or equal to 1.25. As a result, the network of bonds in the protective film 107 becomes dense, and the moisture permeability as a solid also becomes a particularly good level.

If the protective film 107 is too thin, the coverage with respect to the array of the organic light emitting elements 113 or foreign matter, which is covered by the protective film 107, is lowered, and a low-density region, which will be described later, can also occur in the vicinity of the surface of the protective film 107. As a result, it becomes more likely for a dark spot (DS) to occur. In contrast, if the protective film 107 is too thick, the process time for manufacturing the organic light emitting device 100 becomes long, and thus productivity decreases. Further, if the protective film 107 is too thick, the distance between the color filter layer 109 and the organic compound film 105 becomes too large, so that a color shift is likely to occur. Therefore, the thickness of the protective film 107 may be, for example, greater than or equal to 1.0 μm and less than or equal to 3.0 μm.

A planarization film 108 is disposed on the protective film 107. A color filter layer 109 is disposed on the planarization film 108. The color filter layer 109 may include color filters 109a, 109b, and 109c that transmit light of mutually different wavelengths. A planarization film 110 is disposed on the color filter layer 109. The planarization films 108 and 110 are formed of, for example, resin. A planarization film 110 is disposed on the filling film 111. The filling film 111 is formed of, for example, resin. A glass substrate 112 is disposed on the filling film 111.

One electrode 106 is assigned to each of the color filters 109a, 109b, and 109c. As a result, sub-pixel circuits PXa, PXb, and PXc are configured for the color filters 109a, 109b, and 109c, respectively. The three sub-pixel circuits PXa, PXb, and PXc constitute one pixel circuit PX. By controlling the light emission amounts of each of the three sub-pixel circuits PXa, PXb, and PXc, the pixel circuit PX can support a color display.

Figure 2:
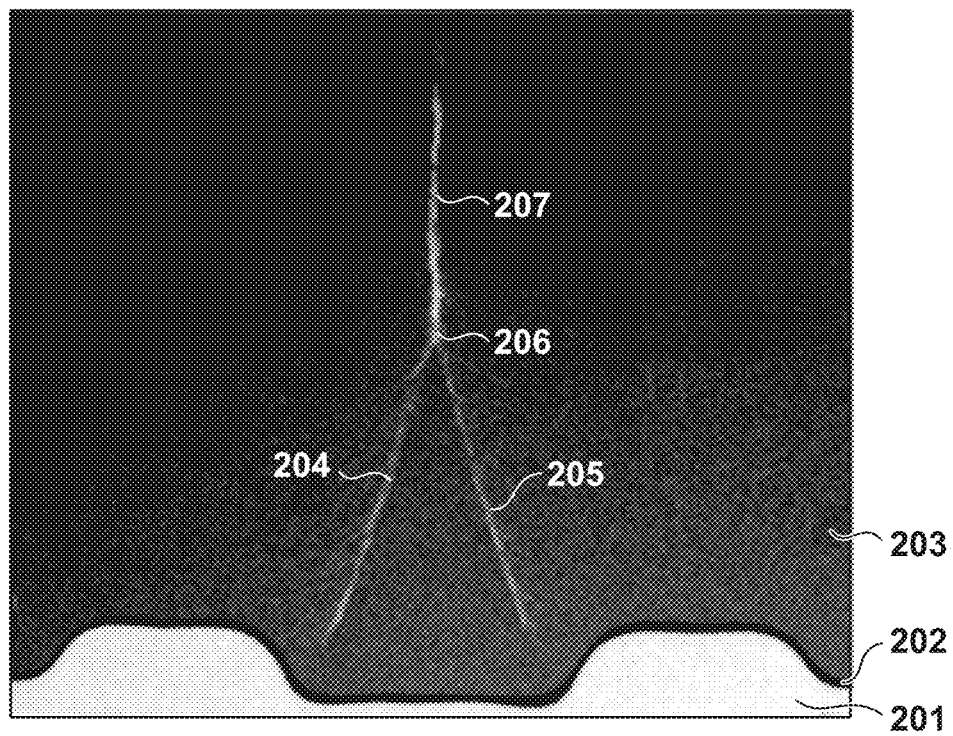
FIG. 2 is a cross-sectional TEM photograph of a typical organic light emitting device.

Referring to FIG. 2, a low-density region that occurs in the protective film of the organic light emitting device will be described. FIG. 2 is a cross-sectional TEM (transmission electron microscope) photograph of the organic light emitting device, focusing on the upper side of the organic compound film 201, the electrode 202, and the lower side of the protective film 203.

The inventors have discovered that, when the upper surface of the underlying layer (the electrode 202 in the example of FIG. 2) in contact with the lower surface of the protective film 203 formed of silicon nitride has unevenness, a low-density region is generated in the protective film 203 due to the unevenness of the underlying layer. The protective film 203 of FIG. 2 has low-density regions 204, 205, and 207. The low-density regions are regions having a lower density than that of the vicinity.

The low-density region 204 extends from the lower left corner of a lower convex portion of the protective film 203. The low-density region 205 extends from the lower right corner of the lower convex portion of the protective film 203. The low-density region 204 and the low-density region 205 converge at a converging position 206, and extend upward as a low-density region 207. The low-density regions 204, 205, and 207 are more permeable to moisture than the surrounding portions. It is also believed that the greater the width of the low-density regions 204, 205, and 207, and the lower the density, the easier that moisture will pass through. The occurrence of the low-density regions 204, 205, and 207 lowers the moisture resistance of the protective film 203.

Figure 3:
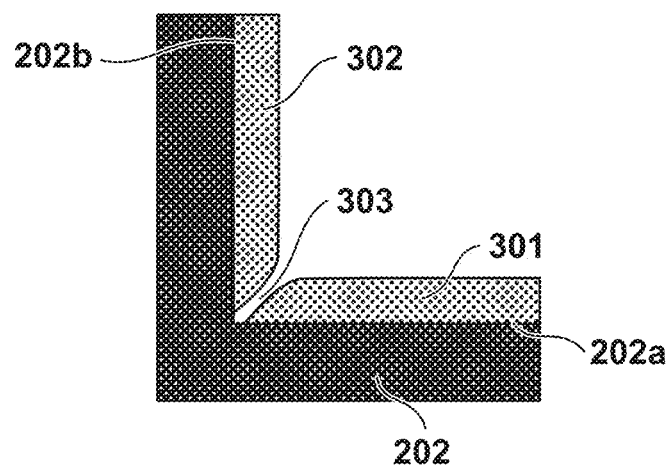
FIG. 3 is a schematic view illustrating a state in the middle of forming a silicon nitride film.

Referring to FIG. 3, a reason why the low-density region is generated in the protective film 203 will be described. FIG. 3 is a schematic diagram illustrating a state in which the protective film 203 is in the process of being formed on the electrode 202. The protective film 203 is formed by depositing the material of the protective film 203 on the electrode 202 by chemical vapor deposition (CVD). In order to make it easier to understand the description, it is assumed that a convex portion of the upper surface of the electrode 202 rises at a right angle. Therefore, a concave portion of the upper surface of the electrode 202 has a horizontal surface 202a and a vertical surface 202b.

The material of the protective film 203 is grown from each of the horizontal surface 202a and the vertical surface 202b of the electrode 202. In the middle of the formation, a deposit 301 adheres to the horizontal surface 202a, and a deposit 302 adheres to the vertical surface 202b. A gap 303 occurs between the deposit 301 and the deposit 302. The deposit 301 grows in a direction (an upward direction in the figure) away from the horizontal surface 202a. The deposit 302 grows in a direction (a rightward direction in the figure) away from vertical surface 202b. Since it is difficult for source gas that is used for deposition to reach the gap 303, it is assumed that a film deposition rate of this portion is slower than that of other portions. As a result, it is considered that the density of the position corresponding to the gap 303 gets low even after the deposition of the protective film 203, and as a result, a low-density region is generated at this position.

Since the supply amount of the source gas to the gap 303 is small, it is possible to suppress the generation of the low-density region by efficiently reacting and depositing the source gas. The inventors have found that occurrence of a low-density region can be suppressed by forming the protective film 203 of a material containing silicon atoms and nitrogen atoms and setting the average number of nitrogen atoms bonded to one silicon atom to 1.35 or less.

In a silicon nitride film in which the average number of nitrogen atoms bonded to one silicon atom is 1.35 or less, dangling bonds are easily exposed on the film surface because the number of bonds between silicon atoms and nitrogen atoms is low. It is considered that a dangling bond on the film surface traps a small amount of the source gas in the gap 303, whereby reactions and the deposition rate in the gap 303 are improved and the occurrence of a low-density region is suppressed.

The average number of nitrogen atoms bonded to one silicon atom may be measured or calculated, for example, with reference to a method described in R. Karcher et al., Physical review B, 1984, Vol. 30, No. 4, pp. 1896-1910. Specifically, the average number can be measured or calculated as follows. Firstly, a Si2p spectrum of a silicon nitride film is measured by using X-ray photoelectron spectroscopy (XPS). The measurement environment is a high-vacuum of $1 \times 10^{-7}$ Torr or less. Before measurement, sputtering is performed on the surface of the silicon nitride film using an Ar ion gun or the like in order to remove the oxide film and contamination. The measuring device may be a Quantera SXM manufactured by ULVAC-PHI, Inc. If required, the energy axes of the Si2p spectra of the silicon nitride film may be corrected with reference to the binding energy values of the main peaks of pure metals such as Au, Ag, and Cu, which are relatively stable.

Figure 4A:
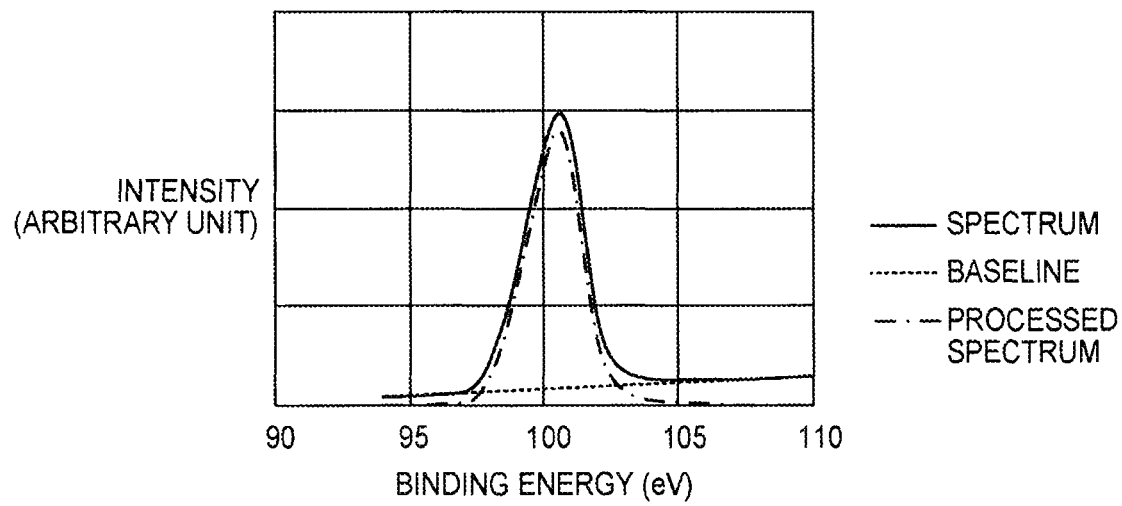
FIGS. 4A and 4B are diagrams illustrating a method of calculating an average number of nitrogen atoms bonded to one silicon atom.
Figure 4B:
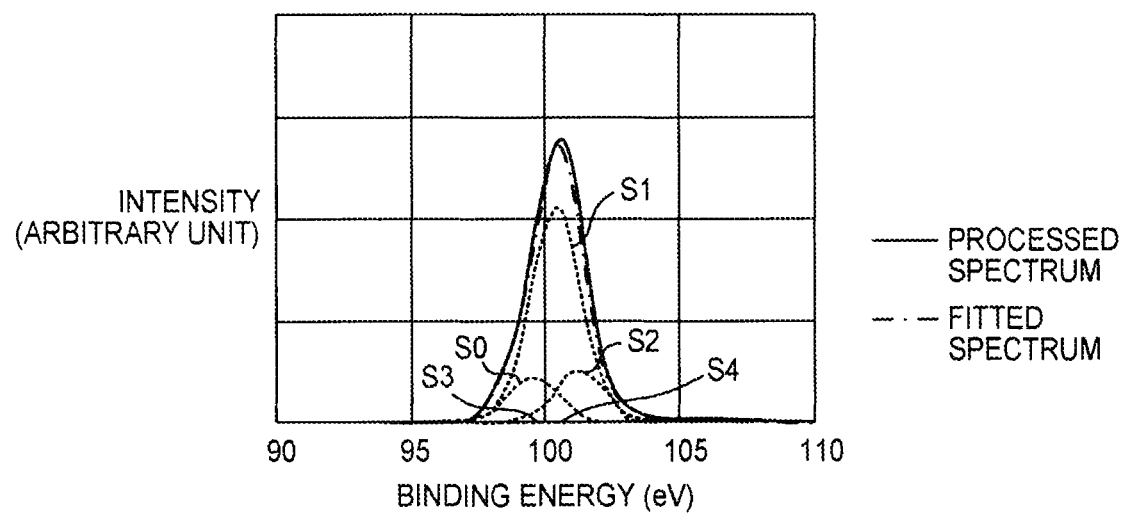

Referring to FIG. 4A and FIG. 4B, the spectrum of the silicon nitride film will be described. In the FIG. 4A, the solid line indicates the Si2p spectrum of the silicon nitride film, and the dotted line indicates a baseline. The dashed-dotted line in FIG. 4A is a graph obtained by fitting regions other than the peaks of the Si2p spectrum, and subtracting the baseline from the Si2p spectrum. The spectrum after this processing is called a processed spectrum.

In FIG. 4B, the solid line illustrates the processed spectrum of FIG. 4A, and the dashed-dotted line illustrates a fitted spectrum obtained by performing fitting to the processed spectrum. The fitted spectrum is given by Equation 1 below.

$$\text{(Fitting vector)} = \Sigma_{n=0}^{4} S_n \quad \text{[Equation 1]}$$

The broken lines in FIG. 4B indicates an Si2p spectrum $S_n$ when n nitrogen atoms (n is an integer that is greater than or equal to 0 and less than or equal to 4) are bonded to one silicon atom. $S_n$ is expressed as a normal distribution as in the following Equation 2.

$$S_n = I_n \left( \frac{\sigma}{\sqrt{2\pi}} \right) \exp\left\{ \frac{(E - \mu_n)^2}{2\sigma^2} \right\} \quad \text{[Equation 2]}$$

In Equation 2, E is the binding energy, $\mu_n$ is the center energy of $S_n$ and is 99.5 eV, 100.375 eV, 101.25 eV, 102.125 eV, and 103 eV for n=0, 1, 2, 3, and 4, respectively. $I_n$ and $\sigma$ are fitting parameters. $I_n$ is the intensity of $S_n$ and is calculated individually for each n. $\sigma$ is the standard deviation of $S_n$, and a common value is obtained for each n.

By applying $I_n$ obtained by fitting to the following Equation 3, the average number of nitrogen atoms bonded to one silicon atom can be obtained.

$$\text{(Average number of nitrogen atoms bonded to one silicon atom)} = \left( \frac{\sum_{n=1}^{4} n I_n}{\sum_{n=0}^{4} I_n} \right) \quad \text{[Equation 3]}$$

In the protective film 107, the center of gravity of binding energy of the Si2p spectrum in X-ray photoelectron spectroscopy may be 100.2 eV or more and 100.6 eV or less. The center of gravity may be less than 100.2 eV. As described above, the average number of nitrogen atoms bonded to one silicon atom is a number obtained by analyzing the shape of the Si2p spectrum in accordance with XPS. This can also be expressed as the center of gravity of the binding energy of the Si2p spectrum. By setting the center of gravity of the binding energy of the Si2p spectrum to 100.6 eV or less, the occurrence of low-density regions in the protective film 107 can be suppressed. The center of gravity of the binding energy is an amount obtained by, in the processed spectrum, dividing an amount, which is obtained by integrating the product of intensity and binding energy in a range of the binding energy where the spectrum is present by the binding energy, by an amount obtained by integrating the intensity by the binding energy in the same range.

In the protective film 107, an amount obtained by dividing the average number of nitrogen atoms bonded to one silicon atom by the composition ratio of nitrogen atoms to silicon atoms may be greater than or equal to 1.2 and less than or equal to 1.55. The amount may be less than 1.2. The composition ratio of nitrogen atoms to silicon atoms can be calculated as follows. By dividing the average number of nitrogen atoms bonded to one silicon atom by the composition ratio of nitrogen atoms with respect to silicon atoms, information on bonding between silicon atoms and nitrogen atoms can be extracted.

First, as described above, the Si2p spectrum of the silicon nitride film is measured using XPS, and as illustrated in FIG. 4A, the baseline is subtracted so as to calculate the area of the spectrum. Similarly, the area of the N1s spectrum is calculated. Then, a relative sensitivity coefficient is used to calculate the atomic concentration ratio (composition ratio) of nitrogen atoms to silicon atoms.

Figure 5A:
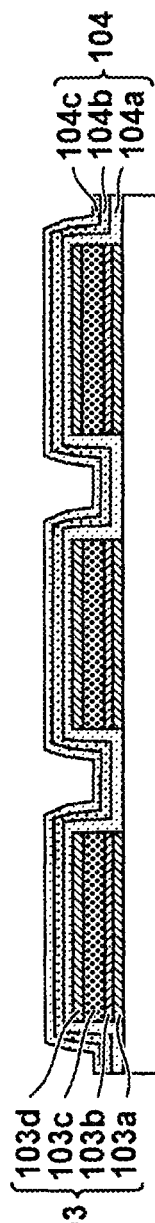
FIGS. 5A to 5C are cross-sectional views schematically illustrating a method of manufacturing an organic light emitting device according to a first embodiment of the present disclosure.
Figure 5B:
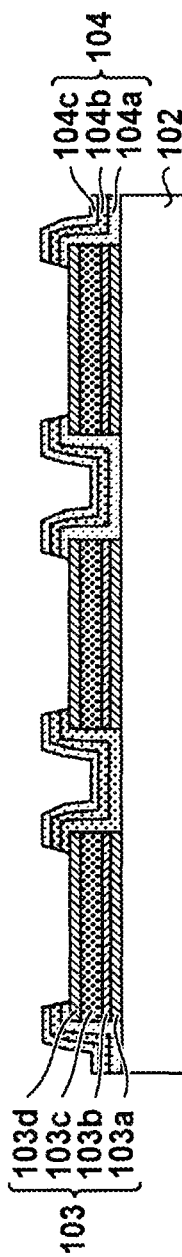
Figure 5C:
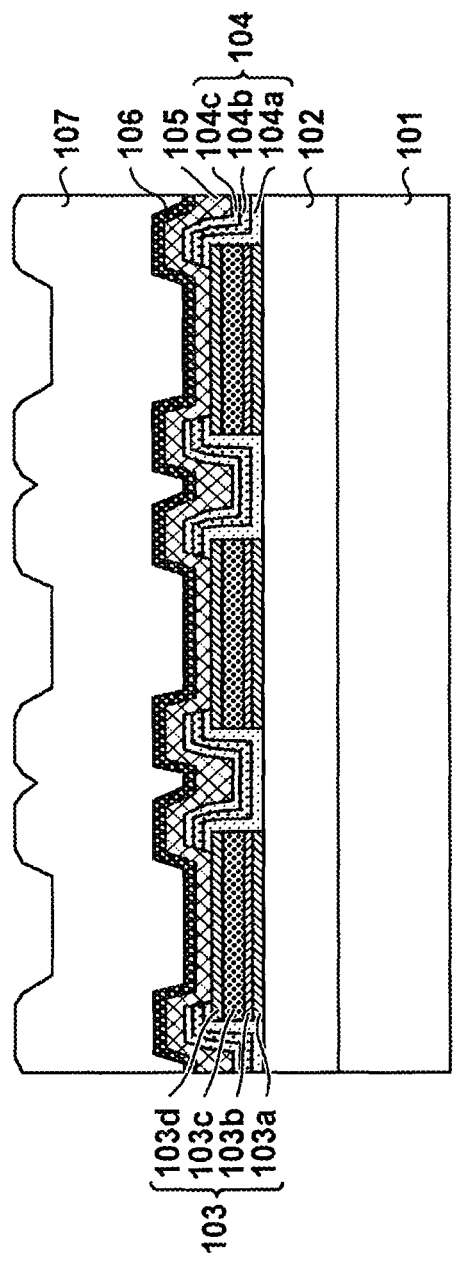

Referring to FIG. 5A to FIG. 5C, an exemplary method of manufacturing the organic light emitting device 100 will be described. First, the structures illustrated in FIG. 5A are formed. Specifically, a switching circuit and a wiring pattern (not illustrated) are formed on the substrate 101 by using, for example, an existing photolithography technique. Thereafter, the inorganic insulating film 102 is formed on the substrate 101. Thereafter, a contact hole (not illustrated) is formed in the inorganic insulating film 102, a plug (not illustrated) is formed in the contact hole, and an electrode 103 is formed on the inorganic insulating film 102. The electrodes 103 are formed, for example, by sequentially forming the Ti layer 103a, the TiN layer 103b, the AlCu layer 103c, and the Ti layer 103d. The electrodes 103 are then patterned to configure an array. Thereafter, an insulator 104 is formed on the array of electrodes 103. The insulator 104 is formed, for example, by sequentially forming the TEOS-SiO layer 104a, the HDP-SiO layer 104b, and the TEOS-SiO layer 104c.

Subsequently, as illustrated in the FIG. 5B, the insulator 104 is etched so that the upper surfaces of the electrodes 103 are exposed, thereby forming openings in the insulator 104. Subsequently, as illustrated in FIG. 5C, the organic compound film 105, the electrodes 106, and the protective film 107 are formed in this order on the insulator 104 having the openings formed therein. The organic compound film 105 is formed in accordance with vapor deposition, for example. The electrode 106 is formed by vapor co-deposition of Ag and magnesium, for example. The protective film 107 is formed, for example, by performing plasma CVD using $SiH_4$ gas, $N_2$ gas, and $H_2$ gas in a chamber separate from the electrodes 106. After the electrode 106 is formed, the upper surface of the structure that includes the organic light emitting element 113 has unevenness. Thereafter, the organic light emitting device 100 illustrated in FIG. 1 is manufactured by forming the planarization film 108 and subsequent components.

Second Embodiment

A configuration example of an organic light emitting device 600 according to the second embodiment will be described with reference to FIG. 6. FIG. 6 illustrates a cross section of the organic light emitting device 600 at a position corresponding to FIG. 1. The organic light emitting device 600 is different from the organic light emitting device 100 in further having a protective film 601 and a protective film 602 between the protective film 107 and the planarization film 108. The protective film 601 is disposed on the protective film 107. The protective film 602 is disposed on the protective film 601. The protective film 107, the protective film 601, and the protective film 602 constitute a protective structure 603.

The protective film 601 is, for example, an aluminum oxide film formed by an atomic layer deposition (ALD) method. Since the aluminum oxide film formed by the ALD method has extremely high coverage with respect to the uneven portion, moisture from the outside of the organic light emitting device 600 is easily blocked. Water vapor used as a gas for depositing aluminum oxide is blocked by the protective film 107 in which formation of a low-density region is suppressed.

The protective film 601, which is an aluminum oxide film formed by the ALD method, may be eluted when exposed to a large amount of water or an alkaline solution at a high temperature. Therefore, a protective film 602 having resistance to these solutions is stacked on the protective film 601. The protective film 602 is, for example, a silicon nitride film or a silicon oxynitride film formed by chemical vapor deposition (CVD). The water permeability of the silicon nitride film or the silicon oxynitride film formed by the CVD method is about $1\times10^{-6}$ (g/(m$^2$·day)), which is sufficiently low.

If the protective structure 300 is too thin, the coverage with respect to the array of the organic light emitting element 113 or foreign matter, which is covered by the protective structure 300, is lowered, and a low-density region can also occur in the vicinity of the surface of the protective structure 300. As a result, it becomes more likely for a dark spot (DS) to occur. In contrast, if the protective structure 300 is too thick, the process time for manufacturing the organic light emitting device 600 becomes long, and thus productivity decreases. Therefore, the thickness of the protective structure 300 (in other words the total thickness of the protective film 107, the protective film 601, and the protective film 602) may be, for example, greater than or equal to 1.6 μm and less than or equal to 3.0 μm, or greater than or equal to 2.0 μm and less than or equal to 2.8 μm. The thickness of the protective film 107 may be two or more times that of the protective film 602.

Other Embodiments

Referring to FIG. 7 to FIG. 12B, various embodiments utilizing the organic light emitting device 100 or 600 described above will be described. Although the organic light emitting device 100 is described below as an example, the organic light emitting device 600 may be used instead of the organic light emitting device 100. The organic light emitting device 100 may be incorporated into any device that generates light. For example, the organic light emitting device 100 may be used as a constituent member of a display device or an illumination device. In addition, it may be used for an exposure light source of an electrophotographic image forming device, a backlight of a liquid crystal display device, a light-emitting device having a color filter as a white light source, or the like. The organic light emitting device 100 may be a part of a device having a touch panel function. The touch panel function may be driven by any of an infrared ray method, an electrostatic capacitance method, a resistive film method, and an electromagnetic induction method. The organic light emitting device 100 may be used as a display unit of a multifunction printer.

Figure 7:
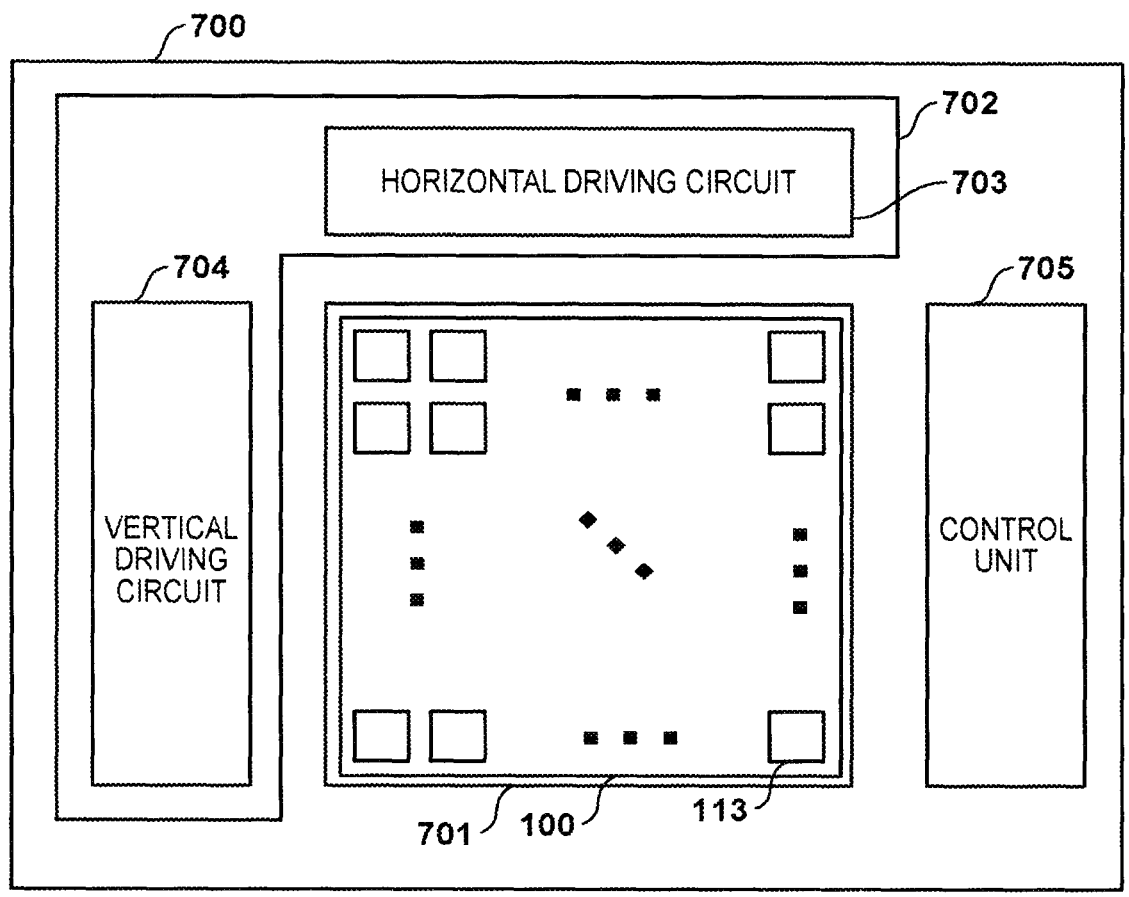
FIG. 7 is a diagram illustrating a configuration example of a display device according to some embodiments of the present disclosure.

FIG. 7 illustrates a configuration example of a display device 700 according to some embodiments. The display device 700 includes a display unit 701 including the organic light emitting device 100, a driving circuit 702 for driving the organic light emitting element 113, and a control unit 705 for controlling the driving circuit 702. The driving circuit 702 includes, for example, a horizontal driving circuit 703 and a vertical driving circuit 704.

The display device 700 may be employed as, for example, a display unit of a television, a PC monitor, a display unit of an automobile, a display unit of a portable terminal, a display unit of a smart phone, a display unit of a tablet terminal, and a display unit of an image forming device such as a multifunction printer or an inkjet printer. The display device 700 may include an image input unit for inputting image information from an area CCD, a linear CCD, a memory card, or the like. A pointing device may be incorporated in the display device 700. A color filter having red, green, and blue may be provided in the color filter layer 109 of the organic light emitting device 100. The red, green and blue color filters may be arranged in a delta arrangement.

Figure 8:
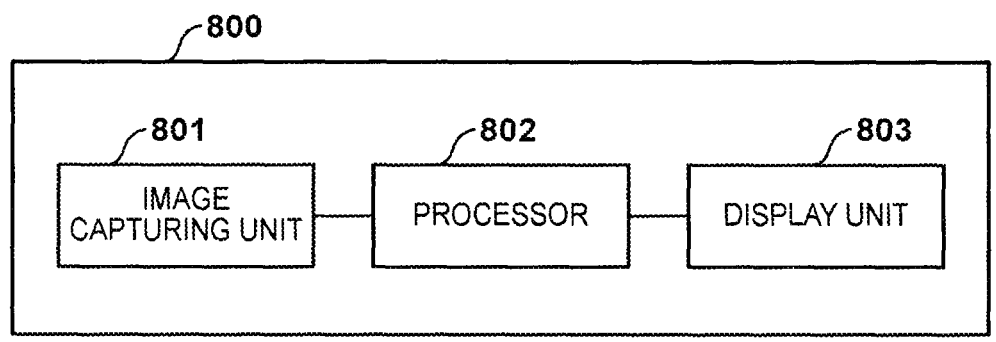
FIG. 8 is a diagram illustrating a configuration example of an image capturing device according to some embodiments of the present disclosure.

FIG. 8 illustrates a configuration example of an image capturing device 800 according to some embodiments. The image capturing device 800 may also be referred to as a photoelectric conversion device. The image capturing device 800 includes an image capturing unit (an image sensor) 801, a processor 802 for controlling the image capturing unit 801 and processing an image captured by the image capturing unit 801, and a display unit 803 for displaying an image. The image capturing unit 801 includes a photoelectric conversion element for converting light into an electric signal. The display unit 803 includes the organic light emitting device 100. The display unit 803 displays, for example, an image obtained by processing an electric signal obtained by the image capturing unit 801 by the processor 802, or information for operation of the image capturing device 800. The image capturing device 800 is an arbitrary device having an image capturing function. The display unit 803 may be, for example, a rear display unit of an image capturing device typified by a digital still camera, a viewfinder, or a display unit provided in another portion. The viewfinder is a display device disposed in the viewfinder of the image capturing device 800. The size of the display area may be, for example, 0.5 inches or less.

Figure 9:
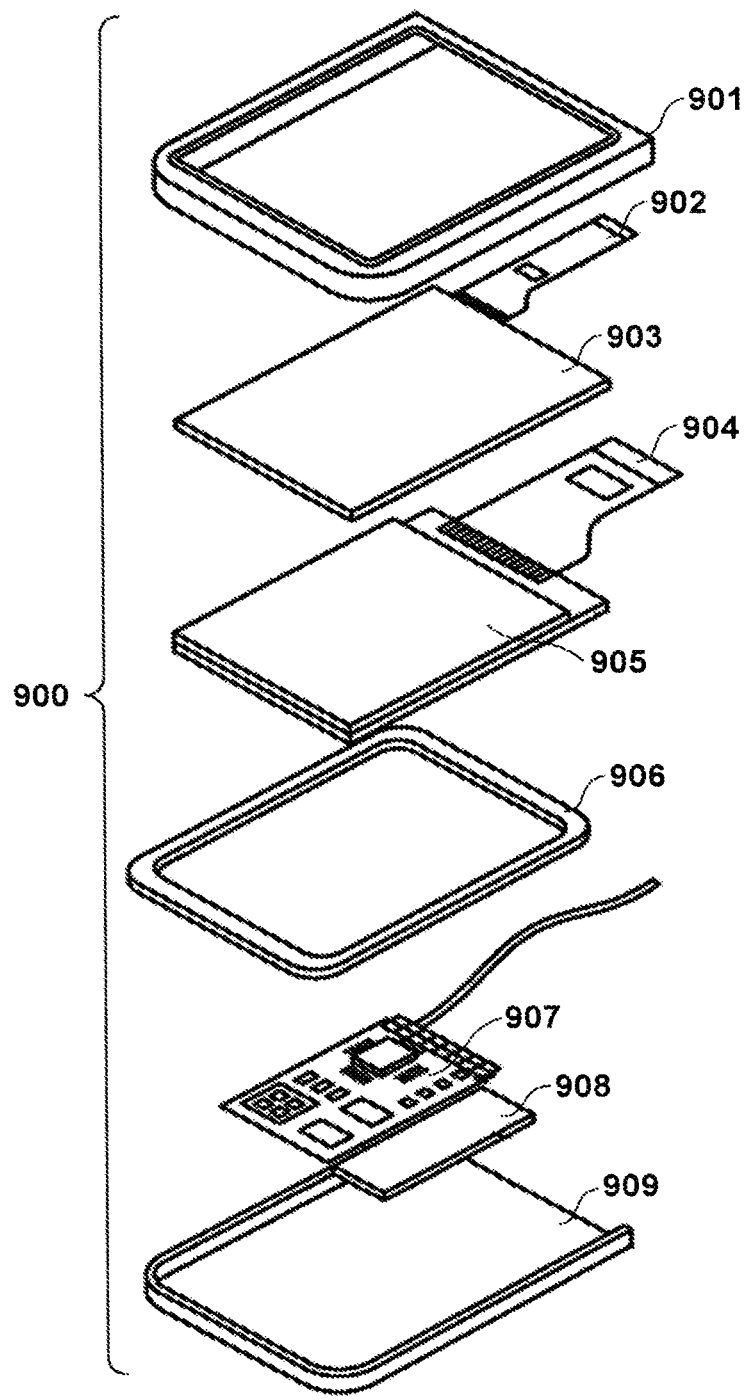
FIG. 9 is a diagram illustrating a configuration example of a display device according to some embodiments of the present disclosure.

FIG. 9 illustrates a configuration example of a display device 900 according to some embodiments. The display device 900 includes a touch panel 903, a display panel 905, a frame 906, a circuit substrate 907, and a battery 908 between an upper cover 901 and a lower cover 909. The display panel 905 includes the organic light emitting device 100. Flexible printed circuits FPC 902 and 904 are connected to the touch panel 903 and the display panel 905. A transistor is printed on the circuit substrate 907. The battery 908 does not need to be provided as long as the display device 900 is not a portable device, and may be provided in another position even if the display device 900 is a handheld device.

The display device 900 may be used as a display unit of an image capturing device that includes an optical unit having a plurality of lenses and an image capturing element that receives light that has passed through the optical unit. The image capturing device may include a display unit for displaying information acquired by the image capturing element. The display unit may be a display unit exposed to the outside of the image capturing device or a display unit that is disposed in the viewfinder. The image capturing device may be a digital camera or a digital video camera.

Figure 10A:
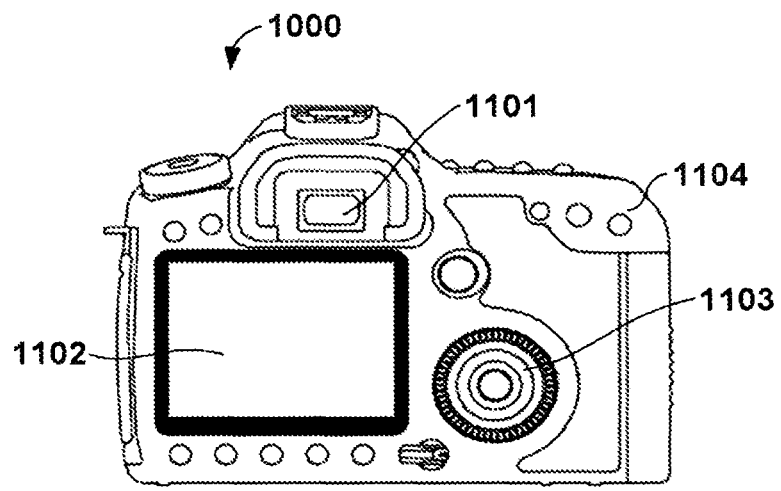
FIGS. 10A and 10B are diagrams illustrating configuration examples of a display device and an electronic device according to some embodiments of the present disclosure.

FIG. 10A illustrates a configuration example of an image capturing device 1000 according to some embodiments. The image capturing device 1000 includes a viewfinder 1001, a rear display 1002, an operation unit 1003, and a housing 1004. The viewfinder 1001 includes the organic light emitting device 100. The viewfinder 1001 may display not only an image to be captured but also environmental information, a capturing instruction, and the like. The environmental information may include the intensity of external light, the direction of the external light, a speed at which a subject moves, and a likelihood that the subject will be occluded by an occluding object. By configuring the viewfinder 1001 with the organic light emitting device 100, the display speed is improved. The image capturing device 1000 has an optical unit (not illustrated). The optical unit has a plurality of lenses, and forms an image on an image capturing element housed in the housing 1004. By adjusting the relative positions of the plurality of lenses, the focus can be adjusted. The adjustment of the focus may be performed automatically.

Figure 10B:
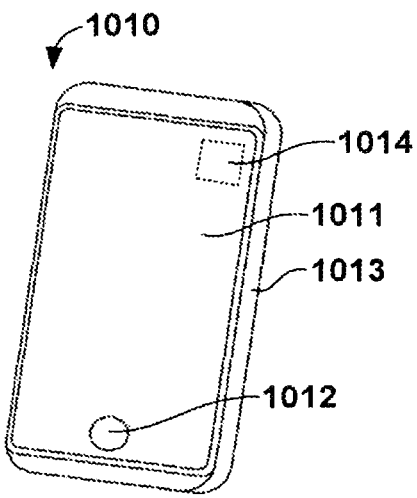

FIG. 10B illustrates a configuration example of an electronic device 1010 according to some embodiments. The electronic device 1010 includes a display unit 1011, an operation unit 1012, a housing 1013, and a communication unit 1014. The display unit 1011 is configured by the organic light emitting device 100. The housing 1013 may contain a circuit, a printed substrate that includes the circuit, a battery, and the communication unit 1014. The operation unit 1012 may be a button or a touch panel type reaction unit. The operation unit 1012 may be a biometric authentication unit for recognizing a fingerprint and performing unlocking or the like. The communication unit 1014 communicates with an external device. The electronic device that includes the communication unit 1014 can also be referred to as a communication device. The electronic device 1010 may be a mobile phone such as a smart phone, a tablet, or a portable terminal such as a head-mounted display.

Figure 11A:
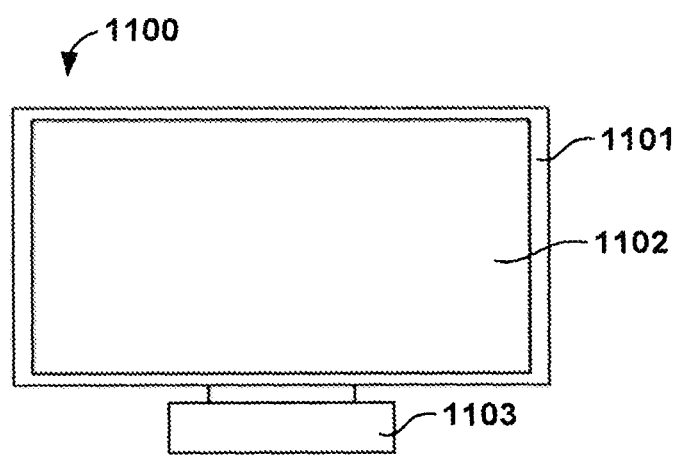
FIGS. 11A and 11B are diagrams illustrating configuration examples of a display device and an electronic device according to some embodiments of the present disclosure.

FIG. 11A illustrates a configuration example of a display device 1100 according to some embodiments. The display device 1100 is a display device such as a television monitor or a PC monitor. The display device 1100 includes a frame 1101, a display unit 1102, and a base 1103. The display unit 1102 includes the organic light emitting device 100. The base 1103 supports the frame 1101 and the display unit 1102. The lower side of the frame 1101 may also serve as a base. The frame 1101 and the display unit 1102 may be curved. The radius of curvature may be greater than or equal to 5000 mm and less than or equal to 6000 mm.

Figure 11B:
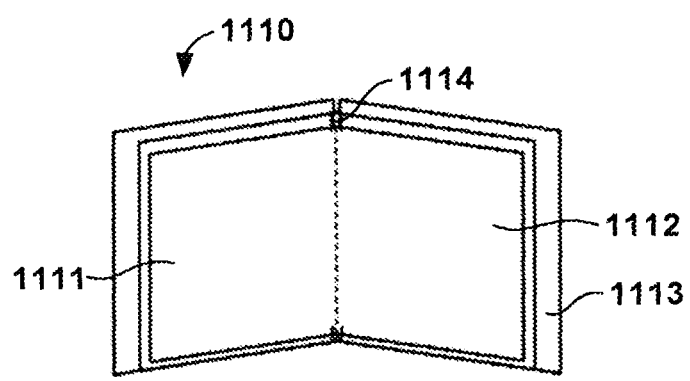

FIG. 11B illustrates a configuration example of a display device 1110 according to some embodiments. The display device 1110 is configured to be foldable, and is a so-called foldable display device. The display device 1110 includes a display unit 1111, a display unit 1112, a housing 1113, and a bending point 1114. The display unit 1111 and the display unit 1112 include the organic light emitting device 100. The display unit 1111 and the display unit 1112 may be one seamless display device. The display unit 1111 and the display unit 1112 are separated at the bending point 1114. The display unit 1111 and the display unit 1112 may display different images or may display one image in cooperation with each other.

Figure 12A:
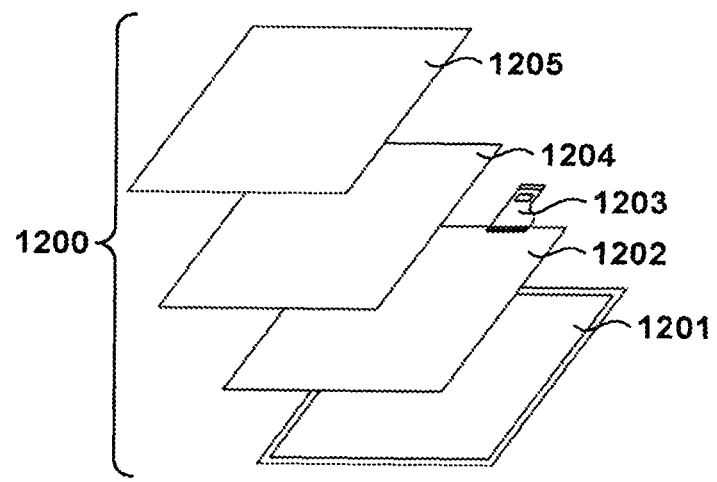
FIGS. 12A and 12B are diagrams illustrating configuration examples of an illumination device and a mobile object according to some embodiments of the present disclosure.

FIG. 12A illustrates a configuration example of an illumination device 1200 according to some embodiments. The illumination device 1200 includes a housing 1201, a light source 1202, a circuit substrate 1203, an optical film 1204, and a light diffusion unit 1205. The light source 1202 includes the organic light emitting device 100. The optical film 1204 may be a filter for improving a color rendering property of the light source 1202. The light diffusion unit 1205, by effectively diffusing the light of the light source 1202, can deliver the light over a wide range. The optical film 1204 and the light diffusion unit 1205 transmit light emitted by the light source 1202. The optical film 1204 and the light diffusion unit 1205 may be provided on the light emission side of the light. The illumination device 1200 may have a cover on an outermost portion.

The illumination device 1200 is, for example, a device for illuminating a room. The illumination device 1200 may emit white, daylight white, or any other color from blue to red. The illumination device 1200 may have a light control circuit for performing light control. The illumination device 1200 may have a power supply circuit. The power supply circuit is a circuit for converting an alternating-current voltage to a direct-current voltage. In addition, white has a color temperature of 4200K, and daylight white has a color temperature of 5000K. The illumination device 1200 may have a color filter. The illumination device 1200 may have a heat radiation unit. The heat radiation unit radiates heat inside the device to the outside of the device, and is formed of metal, liquid silicon, or the like which have a high specific heat.

Figure 12B:
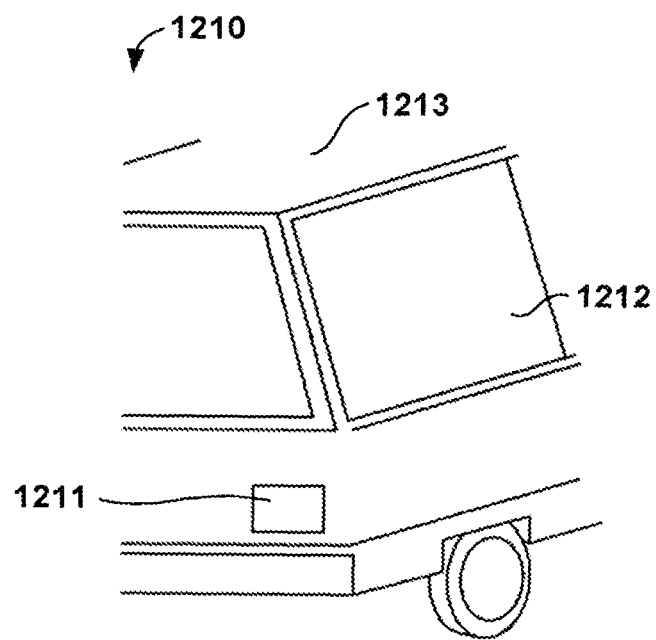

FIG. 12B illustrates a configuration example of an automobile 1210, which is a vehicle, according to some embodiments. The automobile 1210 is an example of a mobile object. The automobile 1210 includes a taillight 1211 which is an example of a lighting appliance, and the taillight 1211 may be turned on in response to a brake operation or the like. The taillight 1211 includes the organic light emitting device 100. The taillight 1211 may include a protective member for protecting the organic light emitting device 100. The protective member has a relatively high strength, is formed of a transparent material, and is made of, for example, polycarbonate or the like. A furan dicarboxylic acid derivative, an acrylonitrile derivative, or the like may be mixed with the polycarbonate.

The automobile 1210 may have a body 1213 and a window 1212 attached thereto. The window 1212 may be a transparent member for confirming the front and rear of the automobile 1210, or may be a transparent display. The transparent display may be constituted by the organic light emitting device 100. In this case, the constituent material of the organic light emitting device 100, such as an electrode, is configured by transparent members.

In addition to the automobile 1210, a mobile object that includes the organic light emitting device 100 may be a ship, an aircraft, a drone, or the like. The mobile object may include a body and a lighting appliance provided on the body. The lighting appliance may emit light to indicate the position of the body. The lighting appliance is configured by the organic light emitting device 100.

Practical Examples

Practical examples of the display device 700 that includes the organic light emitting device 100 described above will be described below. The substrate 101 was formed of silicon. The inorganic insulating film 102 was formed of silicon oxide. As in the above-described examples, the electrodes 103 were formed by a stacked structure of the Ti layer 103a, the TiN layer 103b, the AlCu layer 103c, and the Ti layer 103d. As in the above-described examples, the insulator 104 was formed to have a stacked structure of the TEOS-SiO layer 104a, the HDP-SiO layer 104b, and the TEOS-SiO layer 104c. The angle of the inclined surface of the opening of the insulator 104 was set to 65 degrees, the diameter of the opening was set to 0.7 µm, and the depth (height) of the opening was set to 0.12 µm.

The organic compound film 105 was formed to a thickness of 180 nm by a vapor deposition method. Further, the organic compound film 105 was formed so as to generate white light. As the electron injection layer, a lithium fluoride film having a thickness of 1 nm was formed. The electrode 106 was formed to have a thickness of 10 nm by vapor co-deposition of Ag and magnesium at a ratio of 1:1.

The organic compound film 105 and the electrode 106 were formed so as to cover the display unit 701 (FIG. 7) using a shadow mask. After the electrodes 106 were formed, a protective film 107 made of silicon nitride was formed in a separate chamber in accordance with plasma CVD using $SiH_4$, $N_2$, and $H_2$ gases so as to cover the entire display device 700. The thickness of the protective film 107 was 1 µm. In order to facilitate the evaluation of the characteristics of the protective film 107, the planarization film 108 and a structure formed thereafter were not formed.

Samples of the protective film 107 were formed under nine deposition conditions illustrated in Table 1. These nine conditions are referred to as Practical Examples 1 to 5 and Comparative Examples 1 to 4. From the left-hand column of Table 1, the frequency of the high-frequency power supply, the pressure during source gas inflow, the RF power, the pressure/RF power, the flow rate of $SiH_4$ gas, the flow rate of $N_2$ gas, the flow rate of $H_2$ gas, the distance between the electrodes 103 and 106, the substrate temperature, and the deposition rate are recited. In the pressure (Pa)/RF power (W) column, the fourth decimal place is rounded off.

TABLE 1

| | Frequency (MHz) | Pressure (Pa) | RF power (W) | Pressure (Pa)/RF power (W) | $SiH_4$ flow rate (sccm) | $N_2$ flow rate (sccm) | $H_2$ flow rate (sccm) | Distance between electrodes (mm) | Substrate temperature (° C.) | Deposit rate (nm/min) |
|---|---|---|---|---|---|---|---|---|---|---|
| Practical Example 1 | 27 | 110 | 150 | 0.733 | 18 | 2050 | 405 | 16 | 110 | 83 |
| Practical Example 2 | 27 | 220 | 240 | 0.917 | 18 | 550 | 500 | 16 | 110 | 78 |
| Practical Example 3 | 27 | 180 | 240 | 0.75 | 18 | 1050 | 500 | 16 | 110 | 83 |
| Practical Example 4 | 27 | 240 | 240 | 1 | 14 | 550 | 500 | 16 | 110 | 66 |
| Practical Example 5 | 27 | 190 | 240 | 0.792 | 18 | 550 | 500 | 20 | 110 | 72 |
| Comparative Example 1 | 27 | 160 | 240 | 0.667 | 18 | 2050 | 500 | 16 | 110 | 83 |
| Comparative Example 2 | 27 | 150 | 240 | 0.625 | 18 | 2050 | 405 | 16 | 110 | 84 |
| Comparative Example 3 | 27 | 155 | 240 | 0.645 | 18 | 2050 | 405 | 16 | 120 | 83 |
| Comparative Example 4 | 27 | 150 | 240 | 0.625 | 17 | 2050 | 405 | 16 | 110 | 79 |

The protective film 107 of each sample was measured by XPS, and the average number of nitrogen atoms bonded to one silicon atom was obtained. Before the measurement, the surface of the silicon nitride film was sputtered for 10 minutes using an Ar ion gun in order to remove the oxide film and contamination. For the measuring device a Quantera SXM manufactured by ULVAC-PHI, Inc was used.

Each sample was subjected to a storage test (8585 test) for 3 hours in an environment at a temperature of 85° C. and a relative humidity of 85%. As a result, in Comparative Examples 1 to 4, when the sample after the 8585 test was observed with an optical microscope, a discolored region was formed around the display unit 701. This is because, in accordance with the occurrence of a low-density region in the protective film 107 due to the unevenness of the upper surface of the electrode 106, moisture entered into the organic compound film 105 through the low-density region and diffused into the periphery of the display unit 701. There was no trace of intrusion of moisture in a region having no unevenness because the organic light emitting element 113 is not included, and thus it is considered that water did not permeate from the high-density region portion of the protective film 107.

The reason for the discoloration is that moisture reacts with the electrode 106 to change the transmittance of the electrode 106. The width of the end of the discolored region in a direction perpendicular to the display unit 701 is measured at a plurality of locations around the display unit 701, and the average value is taken as the moisture penetration distance. It is understood that the longer the moisture penetration distance, the greater the degree of the protective film 107 being a low-density region, and thus the more likely for moisture to penetrate the film.

Table 2 summarizes the relationship between the average number of nitrogen atoms bonded to one silicon atom and the moisture penetration distance. As a result, in Practical Examples 1 to 5 in which the average number of nitrogen atoms bonded to one silicon atom in the protective film 107 is greater than or equal to 1 and less than or equal to 1.35, it is evident that the silicon nitride film has high moisture resistance in which the moisture penetration distance is 0 μm and the formation of a low-density region of the protective film 107 is suppressed. In addition, it was understood that there was no correlation between the composition ratio of nitrogen atoms to silicon atoms and the moisture penetration distance. As illustrated in Table 1, the value of pressure (Pa)/RF power (W) was greater than or equal to 0.67 in Practical Examples 1 to 5 and less than 0.67 in Comparative Examples 1 to 4. Therefore, the protective film 107 may be formed so that the value of pressure (Pa)/RF power (W) is greater than or equal to 0.67. Further, the value of the pressure (Pa)/RF power (W) is greater than or equal to 0.72 in each of Practical Examples 1 to 5. Therefore, the protective film 107 may be formed so that the value of the pressure (Pa)/RF power (W) is greater than or equal to 0.72.

TABLE 2

| | Composition ratio N/Si | Average number of N bonded to Si | Center of gravity of binding energy (eV) | (Average number of N bonded to Si) ÷ (Composition ratio N/Si) | Moisture penetration distance (μm) |
|---|---|---|---|---|---|
| Practical Example 1 | 0.84 | 1.02 | 100.54 | 1.22 | 0 |
| Practical Example 2 | 0.88 | 1.19 | 100.18 | 1.36 | 0 |
| Practical Example 3 | 0.92 | 1.23 | 100.19 | 1.34 | 0 |
| Practical Example 4 | 0.93 | 1.3 | 100.41 | 1.4 | 0 |
| Practical Example 5 | 0.88 | 1.33 | 100.37 | 1.51 | 0 |
| Comparative Example 1 | 0.9 | 1.45 | 100.69 | 1.6 | 105 |
| Comparative Example 2 | 0.88 | 1.45 | 100.85 | 1.65 | 87 |
| Comparative Example 3 | 0.89 | 1.46 | 100.8 | 1.63 | 156 |
| Comparative Example 4 | 0.91 | 1.51 | 101.09 | 1.66 | 240 |

In addition, when the center of gravity of binding energies in the Si2p spectrum of XPS was less than or equal to 100.6 eV, it could be confirmed that the moisture penetration distance was 0 μm. It could also be confirmed that the moisture penetration distance was 0 μm when an amount obtained by dividing the average number of nitrogen atoms bonded to one silicon atom by the composition ratio of nitrogen atoms to silicon atoms was less than or equal to 1.55.

Further, an 8585 test was continued for Practical Examples 1 to 5. As a result, it was confirmed that circular discoloration portions (DS) frequently occur in the display unit 701 in each of the samples after a certain time has elapsed. An amount of time after which 50 or more DSs occur frequently in the display unit 701 is defined as the DS appearance time.

Table 3 summarizes the relationship between the average number of nitrogen atoms bonded to one silicon atom and the moisture penetration distance. As a result, it was confirmed that the DS appearance time was longer in Practical Examples 4 to 5, in which the average number of nitrogen atoms bonded to silicon atoms was greater than or equal to 1.25, than in Practical Examples 1 to 3.

TABLE 3

| | Average number of N bonded to Si | Moisture penetration distance (μm) | DS appearance time (h) |
|---|---|---|---|
| Practical Example 1 | 1.02 | 0 | 642 |
| Practical Example 2 | 1.19 | 0 | 642 |
| Practical Example 3 | 1.23 | 0 | 660 |
| Practical Example 4 | 1.3 | 0 | 915 |
| Practical Example 5 | 1.33 | 0 | 833 |

A silicon nitride film of 1 μm was deposited on a transparent glass substrate under the deposition conditions of Practical Examples 1, 3, 5 and Comparative Example 2. The light absorptance of each sample at a wavelength of 450 nm was measured. A spectrophotometer SolidSpec-3700 manufactured by Shimadzu Corporation was used as the measuring device.

Table 4 summarizes the relationship between the average number of nitrogen atoms bonded to one silicon atom and light absorptance. As a result, it could be confirmed that the light absorptance was small when the average number of nitrogen atoms bonded to one silicon atom was greater than or equal to 1.05.

TABLE 4

|  | Average number of N bonded to Si | Light absorptance |
| --- | --- | --- |
| Practical Example 1 | 1.02 | 14% |
| Practical Example 3 | 1.23 | 8% |
| Practical Example 5 | 1.33 | 9% |
| Comparative Example 2 | 1.45 | 8% |

In the embodiment described above, description has been given by taking an organic light emitting device (the organic light emitting device 100 or 600) as an example. The present invention may be applied to a semiconductor device other than an organic light emitting device. Such a semiconductor device includes a semiconductor element that is disposed on a substrate. The organic light emitting element 113 of the organic light emitting device described above (in other words, the organic light emitting device 100 or 600) is an example of a semiconductor element included in the semiconductor device. Like the organic light emitting device described above, the semiconductor device includes a protective film that contains silicon atoms and nitrogen atoms on the semiconductor element. The lower surface of the protective film has unevenness. In order to suppress the occurrence of a low-density region that is caused by the unevenness, the protective film of the semiconductor device has a similar configuration as that of the protective film 107 described above. In the embodiment described above, the case where the lower surface of the protective film has unevenness has been described. Even when the lower surface of the protective film does not have unevenness, the protective film having the above-described characteristics can suppress the occurrence of a low-density region in the protective film.

By the above means, a technique for improving the moisture resistance of a protective film is provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-212482, filed Nov. 12, 2018 which is hereby incorporated by reference herein in its entirety.

What is claimed is:

1. A semiconductor device, comprising:
   a semiconductor element; and
   a protective film disposed above the semiconductor element and containing silicon atoms and nitrogen atoms,
   wherein the protective film includes a first region and a second region having a density lower than a density of the first region, and
   wherein an average number of nitrogen atoms bonded to one silicon atom in the protective film is 1.35 or less.

2. The semiconductor device according to claim 1, wherein the average number of nitrogen atoms bonded to one silicon atom in the protective film is greater than or equal to 1.05.

3. The semiconductor device according to claim 2, wherein a thickness of the protective film is from 1 μm to 3 μm.

4. The semiconductor device according to claim 3, wherein the semiconductor element is an organic light emitting element having a first electrode, a second electrode, and an organic compound film disposed between the first electrode and the second electrode.

5. The semiconductor device according to claim 1, wherein the average number of nitrogen atoms bonded to one silicon atom in the protective film is greater than or equal to 1.25.

6. The semiconductor device according to claim 1, wherein a center of gravity of binding energy of a Si2p spectrum in X-ray photoelectron spectroscopy of the protective film is from 100.2 eV to 100.6 eV.

7. The semiconductor device according to claim 1, wherein, in the protective film, an amount obtained by dividing an average number of nitrogen atoms bonded to one silicon atom by a composition ratio of nitrogen atoms to silicon atoms is from 1.2 to 1.55.

8. The semiconductor device according to claim 1, wherein
   the protective film is a first protective film,
   the semiconductor device further includes a second protective film disposed above the first protective film, and
   the second protective film includes aluminum oxide.

9. The semiconductor device according to claim 1, wherein a lower surface of the protective film has an unevenness, and
   wherein the unevenness overlaps the second region in a plan view.

10. The semiconductor device according to claim 1, wherein the semiconductor element is an organic light emitting element having a first electrode, a second electrode, and an organic compound film disposed between the first electrode and the second electrode.

11. A display device, comprising:
    the semiconductor device according to claim 10; and
    a driving circuit configured to drive the organic light emitting element of the semiconductor device.

12. A photoelectric conversion device, comprising:
    a photoelectric conversion element configured to convert light into an electric signal; and
    a display unit for displaying an image based on the electric signal obtained by the photoelectric conversion element,
    wherein the display unit includes the semiconductor device according to claim 10.

13. An electronic device, comprising:
    a display unit that includes the semiconductor device according to claim 10;
    a housing in which the display unit is provided; and
    a communication unit provided in the housing and configured to communicate with an external device.

14. An illumination device comprising:
    a light source that includes the semiconductor device according to claim 10; and
    a light diffusion unit or an optical film configured to transmit light emitted from the light source.

15. A mobile object, comprising:
a lighting appliance that includes the semiconductor device according to claim 10; and
a body in which the lighting appliance is provided.

16. The semiconductor device according to claim 1, further comprising a plurality of first electrodes,
wherein the second region is overlapped, in a plan view, with a region disposed between one first electrode of the plurality of first electrodes and another first electrode of the plurality of first electrodes.

17. The semiconductor device according to claim 1, wherein the second region includes a pore.

18. A semiconductor device, comprising:
a semiconductor element; and
a protective film disposed above the semiconductor element and containing silicon atoms and nitrogen atoms,
wherein the protective film includes a first region and a second region having a density lower than a density of the first region, and
wherein a center of gravity of binding energy of a Si2p spectrum in X-ray photoelectron spectroscopy of the protective film is from 100.2 eV to 100.6 eV.

19. The semiconductor device according to claim 18, wherein the center of gravity of binding energy of the Si2p spectrum in X-ray photoelectron spectroscopy of the protective film is from 100.2 eV to 100.41 eV, and
wherein a thickness of the protective film is from 1 μm to 3 μm.

20. A semiconductor device, comprising:
a semiconductor element; and
a protective film disposed above the semiconductor element and containing silicon atoms and nitrogen atoms,
wherein the protective film includes a first region and a second region having a density lower than a density of the first region, and
wherein, in the protective film, an amount obtained by dividing an average number of nitrogen atoms bonded to one silicon atom by a composition ratio of nitrogen atoms to silicon atoms is from 1.2 to 1.55.

21. The semiconductor device according to claim 20, wherein a lower surface of the protective film has an unevenness.

22. The semiconductor device according to claim 20, wherein the amount obtained by dividing the average number of nitrogen atoms bonded to one silicon atom by the composition ratio of nitrogen atoms to silicon atoms is from 1.36 to 1.55, and
wherein a thickness of the protective film is from 1 μm to 3 μm.

* * * * *